(12) United States Patent
Sakata et al.

(10) Patent No.: US 7,255,919 B2
(45) Date of Patent: *Aug. 14, 2007

(54) MOLD RELEASE LAYER TRANSFERRING FILM AND LAMINATE FILM

(75) Inventors: Ken Sakata, Shimonoseki (JP); Katsuhiko Hayashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 154 days.

This patent is subject to a terminal disclaimer.

(21) Appl. No.: 10/507,242

(22) PCT Filed: Mar. 11, 2003

(86) PCT No.: PCT/JP03/02852

§ 371 (c)(1),
(2), (4) Date: Jan. 27, 2005

(87) PCT Pub. No.: WO03/077308

PCT Pub. Date: Sep. 18, 2003

(65) Prior Publication Data

US 2005/0167818 A1   Aug. 4, 2005

(30) Foreign Application Priority Data

Mar. 13, 2002 (JP) ............................. 2002-068500
Dec. 10, 2002 (JP) ............................. 2002-358565

(51) Int. Cl.
*B32B 7/12* (2006.01)
*H01L 23/58* (2006.01)
*H05K 1/03* (2006.01)

(52) U.S. Cl. .................... 428/352; 428/41.4; 428/42.3; 428/209; 428/354; 257/642; 174/254; 174/255; 156/329; 156/344

(58) Field of Classification Search ................ 428/352, 428/354, 40.1, 42.2, 42.3, 41.4, 209; 257/642; 174/254, 255; 156/329, 344
See application file for complete search history.

(56) References Cited

U.S. PATENT DOCUMENTS 3,503,782 A * 3/1970 Ayres ...................... 428/211.1
3,554,835 A * 1/1971 Morgan ...................... 156/234
5,073,422 A * 12/1991 Konno et al. ............... 428/40.7
5,082,706 A * 1/1992 Tangney ..................... 428/40.7
5,273,805 A * 12/1993 Calhoun et al. ............ 428/156

(Continued)

FOREIGN PATENT DOCUMENTS

JP            61-50394 A        3/1986

(Continued)

*Primary Examiner*—Cathy F. Lam
(74) *Attorney, Agent, or Firm*—Sughrue Mion, PLLC (57) ABSTRACT

Provision of a releasing layer transfer film which can form, in a simple manner, a releasing layer on a COF flexible printed wiring board, the releasing layer preventing melt adhesion of an insulating layer to a heating tool, thereby enhancing productivity and reliability of semiconductor devices produced by use of a semiconductor chip mounting line.

The releasing layer transfer film 1 for forming a releasing layer onto an insulating layer serving as a component layer of a COF flexible printed wiring board, the releasing layer transfer film includes a transfer film substrate 2 and a transferable releasing layer 3 provided on a surface of the transfer film substrate 2, wherein the transferable releasing layer 3 is formed from a releasing agent and can be transferred onto the insulating layer.

16 Claims, 6 Drawing Sheets

U.S. PATENT DOCUMENTS

| | | | |
|---|---|---|---|
| 5,281,455 A * | 1/1994 | Braun et al. | 428/40.7 |
| 5,759,455 A | 6/1998 | Kamitakahara et al. | |
| 5,965,226 A * | 10/1999 | Muschelewicz et al. | 428/42.3 |
| 6,210,767 B1 * | 4/2001 | Knauf | 428/40.1 |
| 6,280,831 B1 | 8/2001 | Nakanishi et al. | |
| 6,280,851 B1 | 8/2001 | Pasternack et al. | |
| 6,320,135 B1 | 11/2001 | Saito | |
| 6,441,474 B2 | 8/2002 | Naitoh et al. | |
| 6,458,234 B1 | 10/2002 | Lake et al. | |
| 6,476,330 B2 | 11/2002 | Otsuka et al. | |
| 6,521,309 B1 * | 2/2003 | Chen et al. | 428/40.1 |
| 6,548,234 B2 | 4/2003 | Gibson | |
| 6,572,780 B2 | 6/2003 | McCormack et al. | |
| 6,605,369 B1 | 8/2003 | Takahashi et al. | |
| 6,613,987 B2 | 9/2003 | Seki et al. | |
| 6,617,521 B1 | 9/2003 | Saito et al. | |
| 6,624,520 B1 | 9/2003 | Nakamura | |
| 6,761,948 B2 * | 7/2004 | Schwinn | 428/41.3 |
| 6,794,031 B2 | 9/2004 | Murakami et al. | |
| 6,900,989 B2 | 5/2005 | Sakata | |
| 6,911,729 B1 | 6/2005 | Chikawa | |
| 2003/0038379 A1 | 2/2003 | Kawasaki et al. | |
| 2003/0091842 A1 | 5/2003 | Murakami et al. | |
| 2003/0145949 A1 | 8/2003 | Tanaka et al. | |
| 2005/0205972 A1 | 9/2005 | Sakata et al. | |

FOREIGN PATENT DOCUMENTS

| | | |
|---|---|---|
| JP | 61-158153 | 7/1986 |
| JP | 3-138392 A | 6/1991 |
| JP | 3-157414 | 7/1991 |
| JP | 5-315401 | 11/1993 |
| JP | 9-55402 A | 2/1997 |
| JP | 9-115961 A | 5/1997 |
| JP | 9-289323 A | 11/1997 |
| JP | 10-151408 | 6/1998 |
| JP | 2000-138264 | 5/2000 |
| JP | 2000-353726 A | 12/2000 |
| JP | 2001-94232 | 4/2001 |
| JP | 2001-127119 A | 5/2001 |
| JP | 2001-210676 A | 8/2001 |
| JP | 2001-291739 | 10/2001 |
| JP | 2001-351950 | 12/2001 |
| JP | 2002-9108 | 1/2002 |
| JP | 2002-252257 | 9/2002 |
| JP | 2002-289651 A | 10/2002 |
| JP | 2003-338528 | 11/2003 |
| JP | 2004-207669 | 7/2004 |
| JP | 2004-207670 | 7/2004 |
| JP | 2004-207671 | 7/2004 |

* cited by examiner

MOLD RELEASE LAYER TRANSFERRING FILM AND LAMINATE FILM

TECHNICAL FIELD

The present invention relates to a releasing layer transfer film for forming a releasing layer on a flexible printed wiring board; e.g., a COF film carrier tape or a COF flexible printed circuit (FPC), for mounting electronic devices such as ICs and LSIs thereon.

BACKGROUND ART

Development of the electronics industry has been accompanied by sharp demand for printed-circuit boards for mounting electronic devices thereon, such as ICs (integrated circuits) and LSIs (large-scale integrated circuits). Manufacturers have attempted to realize small-size, lightweight, and high-function electronic equipment, which has long been desired. To this end, manufactures have recently come to employ mounting methods making use of a film carrier tape, such as a TAB (tape automated bonding) tape, a T-BGA (ball grid array) tape, an ASIC tape, or an FPC (flexible printed circuit). Use of film carrier tapes for mounting electronic devices thereon has become of increasing importance, especially for manufacturers of personal computers, cellular phones, and other electronic equipment employing a liquid crystal display (LCD) that must have high resolution and flatness, as well as a narrow screen-frame area.

In addition, in order to attain higher-density mounting on a narrower space, IC chips have been mounted on an insulating layer of a flexible printed wiring board. Such a product is called COF (chip-on-film).

Since the flexible printed wiring board serving as a substrate of COFs does not have a device hole, a laminate film obtained by laminating in advance a conductor layer and an insulating layer is employed. When IC chips are mounted directly on the wiring pattern, positioning is performed on the basis of marks such as an inner lead and a positioning mark which are visible from the insulating layer, followed by joining the IC chips and the wiring pattern; i.e., the inner lead, by means of a heating tool (see, for example, Japanese Patent Application Laid-Open (kokai) No. 2002-289651, FIGS. 4 to 6 and paragraphs [0004] and [0005]).

Such a semiconductor chip is mounted while the insulating layer thereof is in direct contact with a heating tool. Since the insulating layer is heated to a considerably high temperature by the heating tool during the course of mounting, a portion of the insulating layer is caused to adhere to the heating tool by melting, thereby causing stoppage of a production apparatus. In addition, unfavorable deformation of the carrier tape occurs. In the case where the insulating layer is melt-adhered to the heating tool, the heating tool is stained, thereby deteriorating reliability and productivity.

Such melt adhesion to the heating tool is critical when semiconductor chips are mounted on a COF film carrier tape or a COF FPC having no device hole.

The present invention has been made to solve the aforementioned problems, and an object of the present invention is to provide a releasing layer transfer film which can form, in a simple manner, a releasing layer on a COF flexible printed wiring board, the releasing layer preventing melt adhesion of an insulating layer to a heating tool, thereby enhancing productivity and reliability of semiconductor devices produced by use of a semiconductor chip mounting line.

DISCLOSURE OF THE INVENTION

In order to attain the aforementioned object, a first mode of the present invention provides a releasing layer transfer film for forming a releasing layer onto an insulating layer serving as a member of a COF flexible printed wiring board, characterized in that the releasing layer transfer film comprises a transfer film substrate, and a transferable releasing layer provided on a surface of the transfer film substrate, wherein the transferable releasing layer is formed from a releasing agent and can be transferred onto the insulating layer.

According to the first mode, a releasing layer can be provided on an insulating layer of a COF flexile printed wiring board in a relatively simple manner by transferring the transferable releasing layer formed on the transfer film substrate onto the insulating layer serving as a member of a COF flexible printed wiring board.

A second mode of the present invention is drawn to a specific embodiment of the releasing layer transfer film of the first mode, wherein the transferable releasing layer comprises a silicone-based compound.

According to the second mode, the releasing layer which is to be in contact with a heating tool comprises a silicone-based compound, whereby melt adhesion or a similar phenomenon can be reliably prevented.

A third mode of the present invention is drawn to a specific embodiment of the releasing layer transfer film of the second mode, wherein the transferable releasing layer is formed from a releasing agent containing at least one species selected from among a siloxane compound, a silane compound, and silica sol.

According to the third mode, the transferable releasing layer is formed from a releasing agent containing a siloxane compound, a silane compound, or silica sol, and is effectively transferred onto an insulating layer of a COF flexible printed wiring board.

A fourth mode of the present invention is drawn to a specific embodiment of the releasing layer transfer film of the second mode, wherein the transferable releasing layer is formed from a releasing agent containing at least one species selected from a silane compound and silica sol.

According to the fourth mode, the transferable releasing layer is formed from a releasing agent containing a silane compound or silica sol, and is effectively transferred onto an insulating layer of a COF flexible printed wiring board.

A fifth mode of the present invention is drawn to a specific embodiment of the releasing layer transfer film of the fourth mode, wherein the transferable releasing layer is formed from a releasing agent containing a silazane compound.

According to the fifth mode, the transferable releasing layer is formed from a releasing agent containing a silazane compound, which is a type of silane compound, and is effectively transferred onto an insulating layer of a COF flexible printed wiring board.

A sixth mode of the present invention is drawn to a specific embodiment of the releasing layer transfer film of the third mode, wherein the transferable releasing layer is formed by applying a solution of the releasing agent onto the transfer film substrate, and heating.

According to the sixth mode, the transferable releasing layer for providing a releasing layer which reliably prevents melt adhesion is formed through coating on a surface of the transfer film substrate.

A seventh mode of the present invention is drawn to a specific embodiment of the releasing layer transfer film of the fourth mode, wherein the transferable releasing layer is formed by applying a solution of the releasing agent onto the transfer film substrate, and heating.

According to the seventh mode, the transferable releasing layer for providing a releasing layer which reliably prevents melt adhesion is formed through coating on a surface of the transfer film substrate.

An eighth mode of the present invention is drawn to a specific embodiment of the releasing layer transfer film of the fifth mode, wherein the transferable releasing layer is formed by applying a solution of the releasing agent onto the transfer film substrate, and heating.

According to the eighth mode, the transferable releasing layer for providing a releasing layer which reliably prevents melt adhesion is formed through coating on a surface of the transfer film substrate.

A ninth mode of the present invention is drawn to a specific embodiment of the releasing layer transfer film of any of the first to eighth modes, wherein the transferable releasing layer is transferred by firmly affixing the transferable releasing layer to the insulating layer, followed by heating.

According to the ninth mode, the transferable releasing layer is effectively transferred by firmly affixing the transferable releasing layer to the insulating layer, followed by heating.

A tenth mode of the present invention is drawn to a specific embodiment of the releasing layer transfer film of any of the first to eighth modes, wherein the transferable releasing layer is provided on a surface of the transfer film substrate continuously or in the form of dispersed islands.

According to the tenth mode, the transferable releasing layer is provided on a surface of the transfer film substrate continuously or in the form of dispersed islands, and is effectively transferred onto the insulating layer of a COF flexible printed wiring board.

An eleventh mode of the present invention is drawn to a specific embodiment of the releasing layer transfer film of any of the first to eighth modes, wherein the transferable releasing layer is transferred onto the insulating layer continuously or in the form of dispersed islands.

According to the eleventh mode, at least a portion of the transferable releasing layer is transferred onto a surface of the insulating layer, thereby effectively forming a continuous portion or a portion of the transferable releasing layer in the form of dispersed islands on the insulating layer.

A twelfth mode of the present invention is drawn to a specific embodiment of the releasing layer transfer film of any of the first to eighth modes, wherein the transferable releasing layer is provided so as to correspond to a region for forming the wiring pattern, the region intervening in at least two rows of sprocket holes of the COF flexible printed wiring board.

According to the twelfth mode, the transferable releasing layer is present between two rows of sprocket holes, and the insulating layer is effectively formed on the COF flexible wiring board.

A thirteenth mode of the present invention is drawn to a specific embodiment of the releasing layer transfer film of the twelfth mode, wherein the COF flexible wiring board has at least two rows of wiring-pattern-formed regions, and the transferable releasing layer is provided such that a plurality of stripes of the layer correspond to the wiring patterns.

According to the thirteenth mode, a releasing layer in the form of a plurality of stripes is formed, corresponding to the wiring patterns, on an insulating layer of a multi-stripe COF flexible printed wiring board.

A fourteenth mode of the present invention is drawn to a specific embodiment of the releasing layer transfer film of any of the first to eighth modes, which has, between the transfer film substrate and the transferable releasing layer, an adhesion layer that can be exclusively released from the transferable releasing layer.

According to the fourteenth mode, the transferable releasing layer is formed on a surface of the transfer film substrate by the mediation of the adhesion layer.

A fifteenth mode of the present invention is drawn to a specific embodiment of the releasing layer transfer film of any of the first to eighth modes, wherein the transfer film substrate is affixed onto the insulating layer so as to serve as a reinforcing film during a production step of the COF flexible printed wiring board.

According to the fifteenth mode, through employment of the releasing layer transfer film as a reinforcing film, toughness of the insulating layer during a production step of the COF flexible printed wiring board can be enhanced, thereby ensuring a desired mechanical strength of the tape so as to attain smooth conveyance thereof.

A sixteenth mode of the present invention is drawn to a specific embodiment of the releasing layer transfer film of any of the first to eighth modes, which has, on a surface of the transferable releasing layer, a peelable film that can be peeled from the transferable releasing layer.

According to the sixteenth mode, the surface of the transferable releasing layer is protected by the peelable film.

A seventeenth mode of the present invention provides a laminate film, characterized in that the laminate film comprises a film substrate, a releasing layer provided on a surface of the film substrate, and an insulating layer provided on the surface of the releasing layer opposite the side of the film substrate, wherein the releasing layer is formed from a releasing agent containing at least one species selected from a silane compound and silica sol, and the insulating layer serves as a member of a COF flexible printed wiring board.

According to the seventeenth mode, the releasing layer can be provided, in a relatively simple manner, on the insulating layer serving as a member of a COF flexible printed wiring board through peeling of the film substrate, whereby heat adhesion of the insulating layer to a heating tool is prevented during the course of mounting of semiconductor chips (IC).

An eighteenth mode of the present invention is drawn to a specific embodiment of the laminate film of the seventeenth mode, wherein the releasing layer is formed from a releasing agent containing a silazane compound.

According to the eighteenth mode, the releasing layer is formed from a releasing agent containing a silazane compound, which is a type of silane compound, and is effectively provided onto an insulating layer of a COF flexible printed wiring board.

A nineteenth mode of the present invention is drawn to a specific embodiment of the laminate film of the seventeenth mode, which has a conductor layer on the surface of the insulating layer opposite the side of the releasing layer.

According to the nineteenth mode, a COF flexible printed wiring board can be produced by patterning, so as to form a wiring pattern, a conductor layer which has been provided on the surface of the insulating layer opposite the side of the surface on which the releasing layer has been formed.

A twentieth mode of the present invention is drawn to a specific embodiment of the laminate film of the seventeenth mode, which has, between the film substrate and the releasing layer, an adhesion layer that can be exclusively released from the releasing layer.

According to the twentieth mode, the releasing layer is formed on a surface of the film substrate by the mediation of the adhesion layer.

A twenty-first mode of the present invention is drawn to a specific embodiment of the laminate film any of the seventeenth to twentieth modes, wherein the film substrate is affixed onto the insulating layer so as to serve as a reinforcing film during a production step of the COF flexible printed wiring board.

According to the twenty-first mode, through employment of the film substrate as a reinforcing film, toughness of the carrier tape during a production step of the COF flexible printed wiring board can be enhanced, thereby ensuring a desired mechanical strength of the tape so as to attain smooth conveyance thereof.

A twenty-second mode of the present invention is drawn to a specific embodiment of the laminate film of any of the seventeenth to twentieth modes, wherein the film substrate is peeled prior to mounting of a semiconductor chip on the COF flexible printed wiring board, thereby leaving the releasing layer on the insulating layer.

According to the twenty-second mode, a heating tool is not caused to be in direct contact with the insulating layer during mounting of a semiconductor chip, whereby melt adhesion or a similar phenomenon can be reliably prevented.

A twenty-third mode of the present invention is drawn to a specific embodiment of the laminate film of the twenty-second mode, wherein the releasing layer is transferred onto the insulating layer through heating during the course of peeling of the film substrate.

According to the twenty-third mode, the releasing layer is effectively formed firmly onto the insulating layer through heating.

A twenty-fourth mode of the present invention is drawn to a specific embodiment of the laminate film of the twenty-third mode, wherein the releasing layer is transferred onto a surface of the insulating layer continuously or in the form of dispersed islands.

According to the twenty-fourth mode, the releasing layer is formed on the insulating layer of a COF flexible printed wiring board continuously or in the form of dispersed islands, so as to effectively attain the function of the releasing layer.

As described hereinabove, the releasing layer transfer film of the present invention can transfer onto a surface of an insulating layer a transferable releasing layer comprising a specific silicone-based compound serving as a releasing layer. Thus, a releasing layer can be provided on a COF flexible printed wiring board in a simple manner, and melt adhesion of the insulating layer to a heating tool is prevented, thereby enhancing productivity and reliability of semiconductor devices produced by use of a semiconductor chip mounting line.

The laminate film of the present invention is capable of forming a releasing layer comprising a specific silicone-based compound on a surface of an insulating layer in a relatively simple manner by simply peeling the film substrate. Thus, the same effect as that of the aforementioned releasing layer transfer film can be attained.

BEST MODES FOR CARRYING OUT THE INVENTION

The releasing layer transfer film of the present invention provides a releasing layer on an insulating layer serving as a component layer of a COF flexible printer wiring board and comprises a transfer film substrate, and a transferable releasing layer on a surface of the transfer film substrate.

No particular limitation is imposed on the type of transfer film substrate, and any film substrate may be employed so long as the film substrate can effectively transfer a transferable releasing layer serving as a releasing layer onto an insulating layer of a COF flexible printed wiring board. Upon transfer, the transferable releasing layer is caused to be in firm contact with the insulating layer, and is optionally heated in accordance with needs. Thus, the film substrate is required to have sufficient strength and heat resistance to tolerate the transfer treatment. The transfer film substrate may be formed of, for example, a plastic (e.g., PET (polyethylene terephthalate), PI (polyimide), or liquid crystal polymer) film. The transfer film substrate has a thickness of, for example, 15 to 100 μm, preferably 20 to 75 μm.

No particular limitation is imposed on the material for forming the transferable releasing layer provided on a surface of the transfer film substrate, so long as the material has such releasability that adhesion of the releasing layer to a heating tool during mounting of semiconductor chips is prevented and does not induce melt adhesion by heat. Both inorganic and organic materials are employable. Examples of preferred releasing agents include a silicone-based releasing agent, an epoxy releasing agent, and a fluorine-containing releasing agent.

Such a transferable releasing layer preferably comprises a silicone-based compound, an epoxy compound, or a fluorine-containing compound, more preferably a silicone-based compound; i.e., a compound forming a compound having a siloxane bond (Si—O—Si). A: transferable releasing layer comprising a silicone-based compound is preferred, since the layer can be formed in a relatively simple manner and does not tend to adversely affect adhesion of a mold resin even after the releasing layer has been transferred to a semiconductor-chip-mounted side of the film.

Examples of releasing agents for forming a transferable releasing layer comprising a silicone-based compound; i.e., a compound having a siloxane bond, include silicone-based releasing agents. More specifically, such releasing agents contain at least one species selected from among siloxane compounds such as disiloxane and trisiloxane.

Preferably, the releasing agent comprises a compound which transforms into a silicone compound through application and reaction of the releasing agent. Examples of such compounds include silane compounds such as monosilane, disilane, and trisilane; and silica sol compounds.

Thus, a releasing layer comprising a silicone-based compound which is formed through application and reaction of the releasing agent is particularly preferred.

Examples of particularly preferred releasing agents include a releasing agent containing an alkoxysilane compound (a type of silane compound) and a releasing agent containing a silazane compound such as hexamethyldisilazane or perhydropolysilazane, which belongs to silane compounds having an Si—NH—Si structure serving as a precursor for forming a siloxane bond. These releasing agents form a compound having a siloxane bond through application thereof or reaction with moisture or a similar substance contained in air after the application. However, unreacted Si—NH—Si may also be present in the silazane-type releasing agents.

Thus, a releasing layer containing a silicone-based compound which is formed through application and reaction of the releasing agent is particularly preferred.

Although the above releasing agents generally contain an organic solvent, similar releasing agents of aqueous solution type or emulsion form may also be employed.

Specific examples of the releasing agents include silicone resin SR 2411 (trade name: product of Dow Corning Toray Silicone Co., Ltd., containing dimethylsiloxane-based silicone oil, methyltri(methyl ethyl ketoxime)silane, toluene, and ligroin); silicone resin SEPA-COAT (trade name: product of Shin-Etsu Chemical Co., Ltd., containing silazane, synthetic isoparaffin, and ethyl acetate); and COLCOAT SP-2014S (trade name: product of Colcoat Co., Ltd., containing a silane compound). Examples of releasing agents containing silica sol include COLCOAT P and COLCOAT N-103X (trade names: products of Colcoat Co., Ltd.). Silica particles contained in silica sol have a particle size of, for example, 50 to 80 Å.

Notably, provision of a transferable releasing layer comprising a silicone-based releasing agent from a releasing agent containing a silazane compound is particularly preferred, since the releasing agent has excellent releasability for preventing adhesion of the releasing layer to a heating tool during mounting of semiconductor chips and does not induce melt adhesion by heat. Examples of such releasing agents containing a silazane compound include silicone resin SEPA-COAT (trade name: product of Shin-Etsu Chemical Co., Ltd., containing silazane, synthetic isoparaffin, and ethyl acetate).

No particular limitation is imposed on the method for forming such a transferable releasing layer on a surface of the transfer film substrate, and any method such as a coating method or a transfer method may be employed. In the coating method, a releasing agent or a solution thereof may be applied to a surface of a transfer film substrate through spraying, dipping, or roller-coating, followed by heating, to thereby form a transferable releasing layer. Alternatively, when a transferable releasing layer is formed through the transfer method, heat treatment may be performed. The transferable releasing layer has a thickness of, for example, 0.05 to 0.5 µm, preferably 0.1 to 0.3 µm. The transferable releasing layer is not necessarily provided uniformly on the entire surface of the transfer film substrate, and may be provided in the form of dispersed islands. In addition, the releasing layer is not necessarily transferred totally on a surface of the insulating layer by use of a releasing agent layer transfer film tape in which a transferable releasing layer is provided on one entire surface of the transfer film substrate, and the releasing layer may be transferred continuously or in the form of dispersed islands. This is because, when the releasing layer is formed on a surface of the insulating layer continuously or in the form of dispersed islands, direct contact between a heating tool and the insulating layer can be reliably prevented, whereby melt adhesion is effectively prevented.

In the present invention, an adhesion layer may be provided on a surface of the transfer film substrate; i.e., between the transfer film substrate and the transferable releasing layer. The adhesion layer may be produced from a resin material such as acrylic resin series, rubber series, or epoxy resin series. The adhesion layer has a thickness of, for example, 3 to 25 µm, preferably 5 to 15 µm. Examples of the method for forming the adhesion layer include spraying, dipping, and roller-coating.

The aforementioned transferable releasing layer is transferred on the surface of the insulating layer the opposite side of the conductor layer; i.e., opposite the side of the semiconductor-chip (IC)-mount side. In this case, transfer may be performed by means of pressure, pressure and heat, or by means of solely heat. In preferred transfer conditions, heating temperature, load of a roller or pressing, and transfer time are controlled to 15 to 200° C., 5 to 50 kg/cm$^2$, and 0.1 seconds to 2 hours, respectively.

In order to prevent peeling of the releasing layer from the insulating layer, bonding strength between two layers may be enhanced after transfer, through heating or other processes. The heating conditions include a heating temperature of 50 to 200° C., preferably 100 to 200° C., and a heating time of 1 minute to 120 minutes, preferably 30 minutes to 120 minutes.

The releasing layer is provided at any time before the time of mounting semiconductor chips. Thus, the releasing layer may be provided in advance on an insulating layer which has not been provided with a conductor layer, or may be provided simultaneously with the conductor layer. Needless to say, the releasing layer is not necessarily provided through transfer prior to patterning of the conductor layer, but may be provided after patterning of the conductor layer.

The transfer method is preferably employed in the cases in which, for example, the releasing layer is provided on an insulating layer which has not been provided with a conductor layer. In the case where the releasing layer is provided through the transfer method at an initial production stage, the following procedure may be employed. Specifically, the transfer film substrate is not peeled from the releasing layer, so as to serve as a reinforcing film, and the transfer film substrate is removed at a final production step. Thus, through employment of the releasing layer transfer film as a reinforcing film, the strength of a carrier tape attaining smooth conveyance thereof in a production step of a COF flexible printed wiring board is enhanced.

Such a COF flexible printed wiring board has a conductor layer and an insulating layer. No particular limitation is imposed on the laminate film having a conductor layer and an insulating layer and used in the COF flexible printed wiring board, and any type of conductor-insulator laminate film can be employed in the present invention. Examples of such laminate film include a laminate film prepared by sputtering a bond-improving layer (e.g., Ni) on an insulating film (e.g., polyimide film), and plating copper on the bond-improving layer; a casting-type laminate film prepared by applying polyimide to copper foil; and a hot-press-type laminate film prepared through hot-press-adhesion of an insulating film onto copper foil by the mediation of a thermoplastic or thermosetting resin.

In use of the COF flexible printed wiring board, a semiconductor chip is mounted thereon. No particular limitation is imposed on the mounting method. For example, semiconductor chips are mounted by positioning and disposing the COF flexible printed wiring board on semiconductor chips which are placed on a chip stage, and pressing a heating tool against the COF flexible printed wiring board. In this case, the heating tool is heated to at least 200° C., and in some cases, to 350° C. or higher. However, since the COF flexible printed wiring board has a releasing layer formed on the insulating layer, melt adhesion between the heating tool and the insulating layer can be prevented.

In the releasing layer transfer film of the present invention, a peelable film which can be peeled from the transferable releasing layer may be provided on the surface of the aforementioned transferable releasing layer. The peelable film protects the surface of the transferable releasing layer.

In any case, no particular limitation is imposed on the type of the releasing layer transfer film of the present invention, so long as the film can transfer a releasing layer onto the surface of the insulating layer opposite the side of the conductor layer (i.e., the surface opposite the side of the semiconductor-mount side) through peeling of the transfer film substrate before mounting of semiconductor chips.

The laminate film of the present invention contains a film substrate, a releasing layer provided on the film substrate, and an insulating layer provided on the surface of the releasing layer opposite the side of the film substrate, wherein the releasing layer is formed from a releasing agent containing at least one species selected from a silane compound and silica sol, and the insulating layer serves as a member of a COF flexible printed wiring board.

The configuration of the laminate film is not limited to a three-layer configuration; i.e., a film substrate, a releasing layer, and an insulating layer. For example, there may also be employed a four-layer laminate film in which a conductor layer is provided on the surface of the insulating layer opposite the side of the substrate film, or a five-layer laminate film in which an adhesion layer which can be exclusively peeled from the releasing layer is provided between the film substrate and the releasing layer.

Through employment of the laminate film of the present invention, the releasing layer can be left on the insulating layer by peeling the film substrate at any time before mounting of semiconductor chips on a COF flexible printed wiring board. In this case, when the film substrate is peeled after heat treatment, the releasing layer can be more effectively transferred onto the insulating layer.

Similar to the aforementioned releasing layer transfer film, the releasing layer is not necessarily transferred uniformly on the entire surface of the film substrate, and may be transferred continuously or in the form of dispersed islands onto a surface of the insulating layer.

The laminate film of the present invention may be produced by forming an insulating layer on a surface of the transferable releasing layer of the aforementioned releasing layer transfer film or by further forming a conductor layer on the surface of the insulating layer. Alternatively, the laminate film may also be produced by affixing a conductor layer to the insulating layer or by affixing two bi-layer laminate films composed of an insulating layer and a conductor layer. In a still alternative method, a releasing layer is formed on a surface of the insulating layer, followed by forming at least a film substrate on the surface of the releasing layer, thereby producing the laminate film of the present invention.

According to the laminate film of the present invention, when a releasing layer is formed on an insulating layer by peeling the film substrate at any time before mounting of semiconductor chips, as mentioned above, the insulating layer is not brought into direct contact with a heating tool, thereby reliably preventing melt adhesion or a similar phenomenon.

Alternatively, according to the laminate film, when the film substrate is not peeled from the releasing layer in the course of production of a COF flexible printed wiring board, the tape substrate is affixed to the insulating layer and serves as a reinforcing film. Thus, in this case, a desired mechanical strength of the tape so as to attain smooth conveyance thereof in a production step of a COF flexible printed wiring board can be advantageously ensured.

In any case, no particular limitation is imposed on the type of the laminate film of the present invention, so long as the film can form a releasing layer onto the surface of the insulating layer opposite the side of the conductor layer (i.e., the surface opposite the side of the semiconductor-mount side) through peeling of the film substrate before mounting of semiconductor chips.

Hereafter, a releasing layer transfer film according to one embodiment of the present invention will be described with reference to the Example.

Figure 1A:
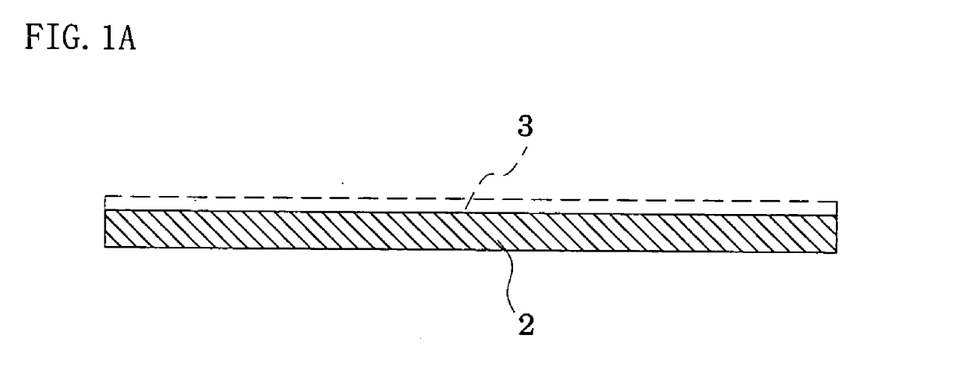
FIGS. 1(A) and 1(B) are cross-sectional views of a releasing layer transfer film according to one embodiment of the present invention.
Figure 1B:
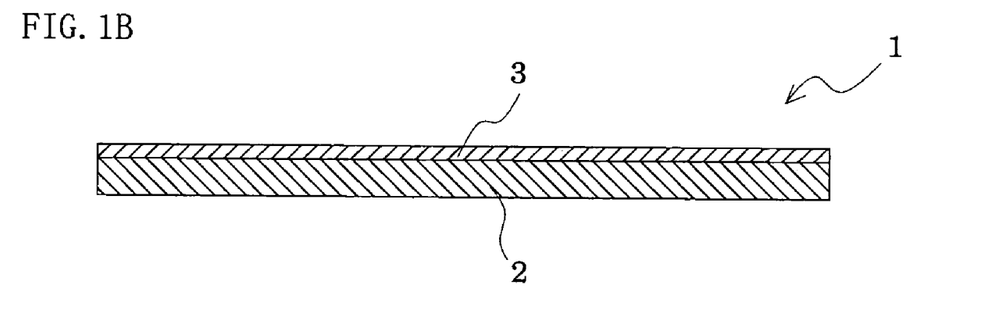

FIGS. 1(A) and 1(B) show a releasing layer transfer film according to one embodiment of the present invention.

As shown in FIGS. 1(A) and 1(B), the releasing layer transfer film 1 according to this embodiment is provided for forming a releasing agent layer onto an insulating layer serving as a member of a COF flexible printed wiring board and includes a transfer film substrate 2 and a transferable releasing layer 3 provided on a surface of the transfer film substrate 2.

The transferable releasing layer 3 may be provided on one entire surface of the transfer film substrate 2 continuously or in the form of dispersed islands. When transferred to a COF film carrier tape, the transferable releasing layer may be provided continuously or in the form of dispersed islands so as to correspond to a region which intervenes in at least two rows of the below-described sprocket holes or a region where semiconductor chips (IC) are to be mounted in a subsequent step. In other words, the region of the transfer film substrate 2 on which the transferable releasing layer 3 is to be formed is arbitrarily determined in accordance with a region of a COF film carrier tape—a target of transferable releasing layer 3—where semiconductor chips are mounted. For example, when the film carrier tape has a plurality of device strips, two strips formed of a releasing agent may be applied by means of two coating rollers to a surface of a long transfer film substrate in a width direction with predetermined intervals, thereby providing two strips of transferable releasing layers continuously in a longitudinal direction. Alternatively, portions of the releasing layer may be provided intermittently (in the form of islands) on the transfer film substrate in a longitudinal direction with predetermined intervals; e.g., intervals corresponding to those of semiconductor chips to be mounted and with an area corresponding to the projection area of a semiconductor chip on the insulating layer. In this embodiment, the transferable releasing layer 3 was provided on one entire surface of the transfer film substrate 2. The transferable releasing layer 3 can be provided by applying a releasing agent on a surface of the transfer film substrate 2. The transferable releasing layer 3 has a thickness, for example, 0.05 to 1 µm, preferably 0.1 to 0.5 µm. Although details will be mentioned after, the transferable releasing layer 3 is transferred to a surface of the insulating layer, thereby providing a releasing layer, which effectively prevents melt adhesion of the insulating layer to a heating tool during mounting of semiconductor chips.

The aforementioned releasing layer transfer film 1 is employed for transferring a releasing layer to an insulating layer which is a member of a COF flexible printed wiring board, at any time before mounting of semiconductor chips on a COF flexible printed wiring board.

Figure 2A:
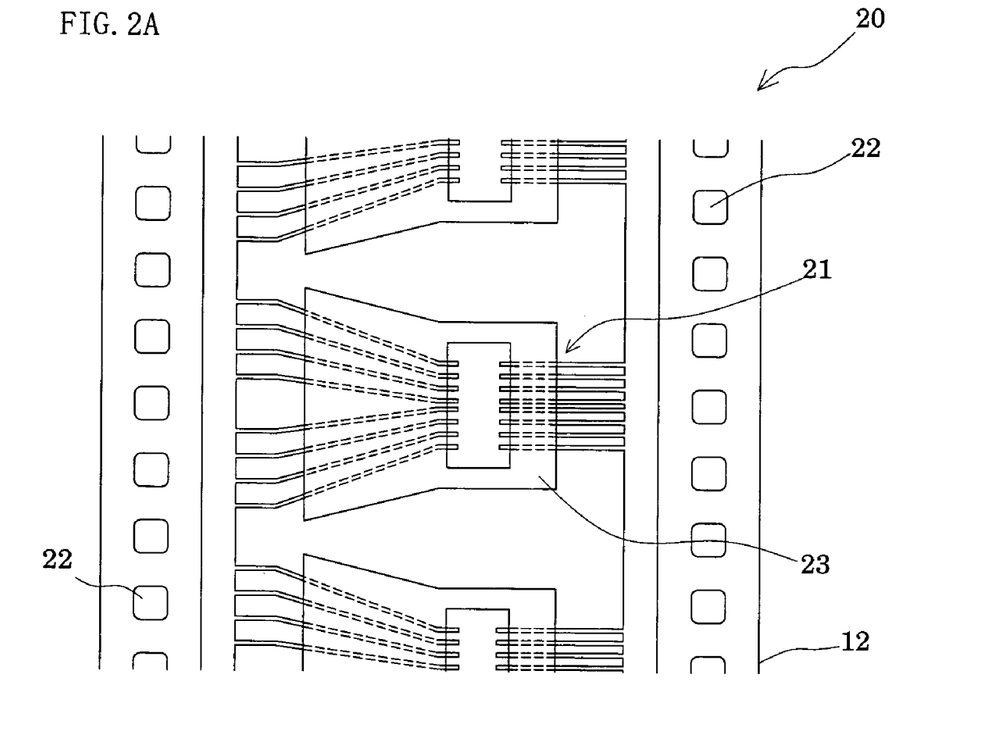
FIGS. 2(A) and 2(B) are schematic sketches of a COF film carrier tape according to one embodiment of the present invention, with (a) being a plan view and (b) being a cross-sectional view.
Figure 2B:
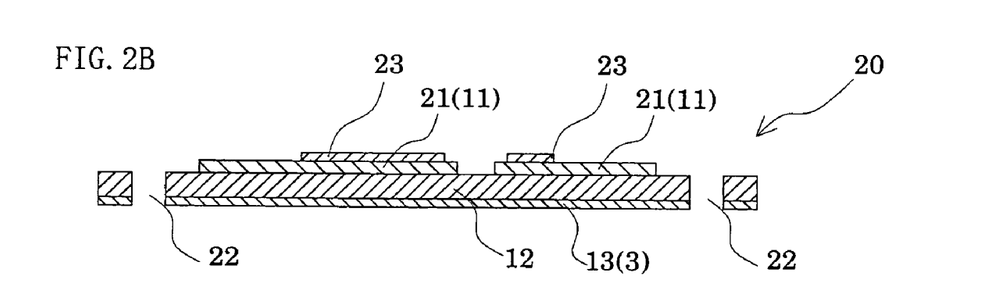

Hereafter, such a COF flexible printed wiring board will be described with reference to FIG. 2. The following embodiment will be described taking a COF film carrier tape as an example. However, needless to say, those with ordinary skill in the art would readily understand that COF FPCs can also be realized in an analogous manner. FIG. 2 shows a COF film carrier tape 20 according to one embodiment of the present invention.

As shown in FIGS. 2(A) and 2(B), the COF film carrier tape 20 according to the present embodiment is formed from a laminate film 10 for producing a COF, the laminate film comprising a conductor layer 11 (copper foil) and an insulating layer 12 (polyimide film). The COF film carrier tape 20 has wiring patterns 21 obtained by patterning the conductor layer 11, and a pair of transversely spaced rows of sprocket holes 22 provided along opposite longitudinal edges of the tape. The wiring patterns 21 are provided on a surface of the insulating layer 12 continuously in the longitudinal direction of the film carrier tape. Each wiring pattern 21 has, on a surface thereof, a solder resist layer 23 which is formed by applying a solder resist coating solution through screen printing. Meanwhile, a wiring pattern may be provided on each surface of the insulating layer (i.e., 2-metal COF film carrier tape). In this case, a releasing agent may be applied or a transferable releasing layer may be transferred exclusively to a region where a heating tool is to be in contact, to thereby form a releasing layer.

Although the conductor layer 11 can be formed from a metal other than copper; e.g., aluminum, gold or silver, a copper layer is generally employed. No particular limitation is imposed on the type of copper layer, and any type of copper layers, such as a copper layer formed through vapor deposition or plating, electrodeposited copper foil, or rolled copper foil, may be employed. Generally, the conductor layer 11 has a thickness of 1 to 70 µm, preferably 5 to 35 µm.

The insulating layer 12 may be formed from, other than polyimide, a polymeric material such as polyester, polyamide, polyether-sulfone, or liquid crystal polymer. Of these, an aromatic polyimide (all repeating units being aromatic) prepared by polymerizing pyromellitic dianhydride and 4,4'-diaminodiphenyl ether is preferred. The thickness of the insulating layer 12 generally falls within a range of 12.5 to 125 µm, preferably 12.5 to 75 µm, more preferably 12.5 to 50 µm.

The laminate film 10 for producing a COF is produced by, for example, applying to a conductor layer 11 (copper foil) a polyimide precursor resin composition containing a polyimide precursor and varnish, to thereby form a coating layer 12a; removing the solvent by drying to thereby form a laminate film; winding the laminate film; and heating the wound laminate film in an oxygen-purged curing furnace for imidization, to thereby form the insulating layer 12. However, no particular limitation is imposed on the method for producing the laminate film.

On the surface of the insulating layer 12 opposite the side of the wiring pattern 21, a releasing layer 13 is formed by transferring a transferable releasing layer 3 of the aforementioned releasing layer transfer film 1.

On the above-described COF film carrier tape 20, chips or electronic devices are mounted. For example, while the tape or substrate is conveyed, semiconductor chips are mounted on the tape, or electronic devices are mounted on a print substrate, to thereby yield COF products. Since the insulating layer 12 has an optical transmittance of 50% or higher, the image of the wiring patterns 21 (e.g., inner lead) can be recognized from the side of the insulating layer 12 by means of a CCD or a similar device. In addition, the wiring patterns 21 of semiconductor chips and printed circuit boards to be mounted can be recognized. Thus, precise positioning of the wiring patterns with respect to the insulating layer can be performed through image processing, thereby mounting electronic devices at high precision.

A method for producing the aforementioned COF film carrier tape 20 will be described with reference to FIGS. 3 and 4. FIG. 3 shows a laminate film and a COF laminate film according to one embodiment of the present invention and an exemplified method for producing the films, while FIG. 4 shows an exemplified method for producing a COF film carrier tape according to one embodiment of the present invention.

In this embodiment, as shown in FIG. 3, a laminate film 100 and a COF laminate film 10 are formed. Thereafter, a COF film carrier tape is produced from the COF laminate film 10.

Figure 3A:
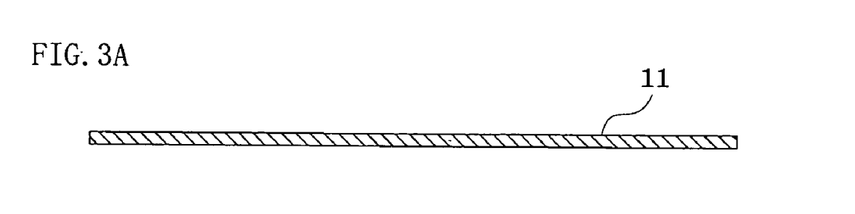
FIGS. 3(A) to 3(E) are cross-sectional views showing a laminate film and a COF laminate film according to one embodiment of the present invention and an exemplified method for producing the films.
Figure 3B:
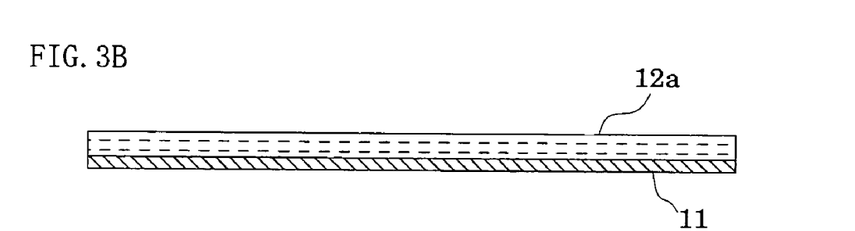
Figure 3C:
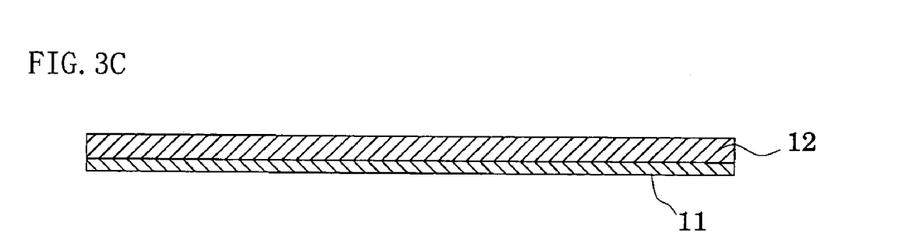
Figure 3D:
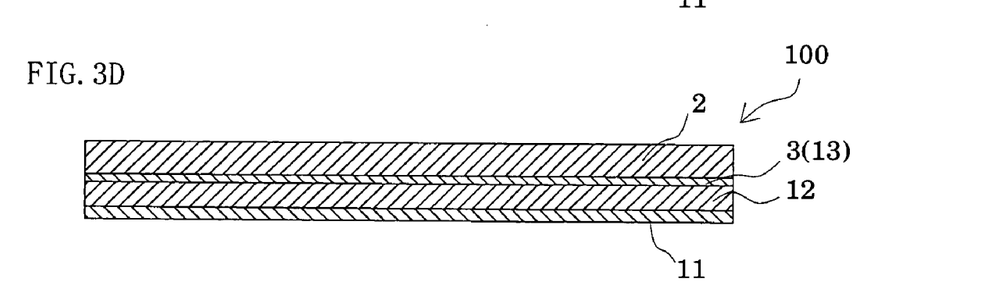
Figure 3E:
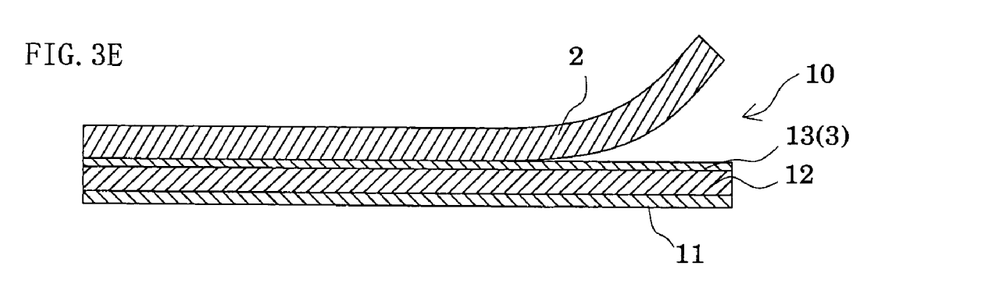

Specifically, the COF laminate film is produced by applying to a conductor layer 11 (copper foil, FIG. 3(A)) a polyimide precursor resin composition containing a polyimide precursor and varnish, to thereby form a coating layer 12a (FIG. 3(B)); removing the solvent by drying to thereby form a laminate film; winding the laminate layer; and heating the wound laminate film in a curing furnace for imidization, to thereby form the insulating layer 12 (FIG. 3(C)). Subsequently, a transferable releasing layer 3 formed on a transfer film substrate 2 serving as a film substrate is brought into firm contact with the surface of the insulating layer 12 opposite to the side of the conductor layer 11, to thereby produce a laminate film 100 (FIG. 3(D)). As shown in FIG. 3(D), the laminate film 100 is composed of a transfer film substrate 2 (film substrate), a transferable releasing layer 3 (releasing layer 13), an insulating layer 12, and a conductor layer 11. Then, the laminate film 100 is heated, and then the transfer film 2 is peeled, thereby forming the COF laminate film 10 having a releasing layer 13 on the surface of the insulating layer 12 opposite the side of the conductor layer 11 (FIG. 3(E)).

Exemplary conditions under which the transfer is performed are, but are not limited to, a heating temperature of 15 to 200° C., a load for rolling or pressing of 5 to 50 kg/cm$^2$, and a treatment time of 0.1 seconds to two hours. Exemplary conditions under which the heating is performed are, but are not limited to, at 50 to 200° C. for one minute to 120 minutes, preferably 100 to 200° C. for 30 minutes to 120 minutes. Examples of the material of the transfer film 2 include PET (polyethylene terephthalate), PI (polyimide), and liquid crystal polymers. The thickness of such transfer film 2 is, for example, 15 to 100 µm, preferably 20 to 75 µm.

Figure 4A:
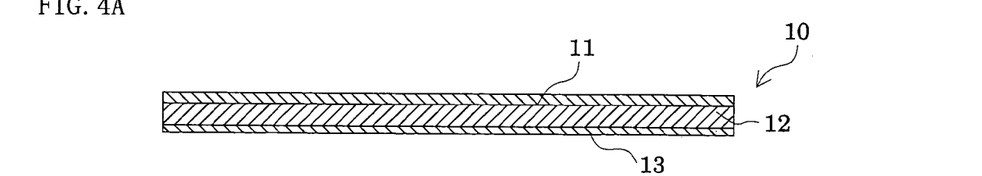
FIGS. 4(A) to 4(F) are cross-sectional views showing an exemplified method for producing a COF film carrier tape according to one embodiment of the present invention.
Figure 4B:
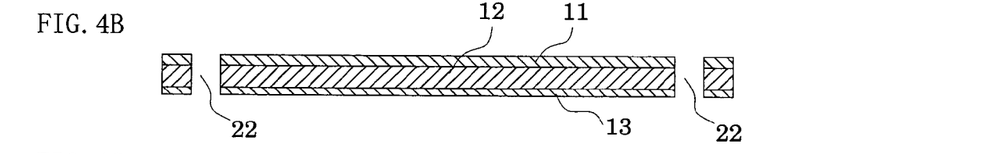
Figure 4C:
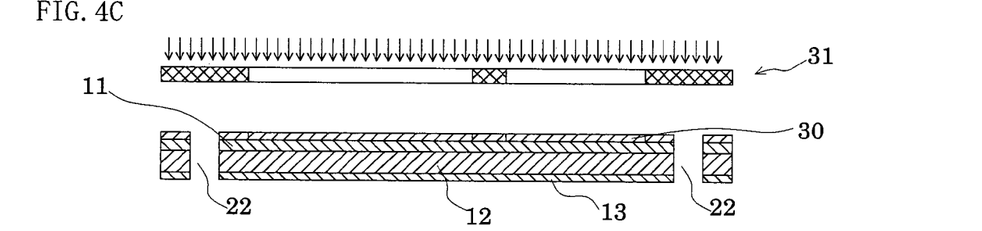
Figure 4D:
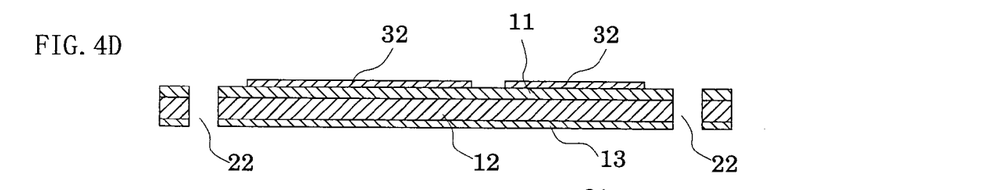
Figure 4E:
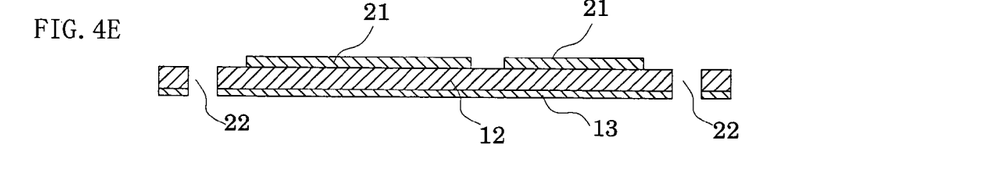
Figure 4F:
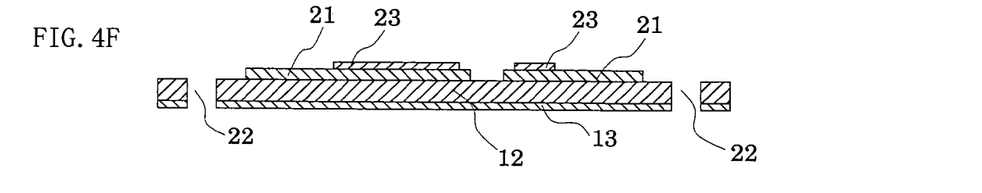

As shown in FIG. 4(A), a COF laminate film 10 composed of a conductor layer 11 and an insulating layer 12 is provided. As shown in FIG. 4(B), sprocket holes 22 are formed, by punching or a similar method, through the COF laminate film 10. These sprocket holes 22 may be formed from the front side or the backside of the insulating layer 12. Then, as shown in FIG. 4(C), a photoresist coating layer 30 is formed on a region of the conductor layer 11 for providing a wiring pattern 21, through a routine photolithographic method involving application of, for example, a negative type photoresist coating solution. Needless to say, a positive type photoresist can also be employed. After the insulating layer 12 is positioned by inserting positioning pins in the sprocket hole 22, the photoresist coating layer 30 is exposed and developed via a photomask 31 for patterning thereof, thereby forming a resist pattern 32 for providing a wiring pattern as shown in FIG. 4(D). Subsequently, the conductor layer 11 is removed by dissolving with an etchant through the resist pattern 32 serving as a mask pattern, and the resist pattern 32 is removed by dissolving with an alkaline solution or a similar material, thereby forming a wiring pattern 21 as shown in FIG. 4(E). The entirety of the thus-formed wiring pattern 21 is plated (e.g., plated with tin) in accordance with needs, and then a solder resist layer 23 is formed through, for example, screen printing, as shown in FIG. 4(F). An outer lead and an inner lead, which are not covered with the solder resist layer 23, are plated with a metal in accordance with needs. No particular limitation is imposed on the material of the metal plating layer, and tin plating, tin alloy plating, nickel plating, gold plating, gold alloy plating, etc. are appropriately performed in accordance with the purpose of use.

In the embodiment described above, the releasing layer 13 was formed before formation of sprocket holes 22. However, the timing of forming the releasing layer is not limited. For example, the releasing layer 13 may be formed before patterning of the conductor layer 11 of the COF laminate film 10, or after removal of the resist pattern 32 with an alkali solution or a similar material and before provision of the solder resist layer 23. Alternatively, the releasing layer 13 may be formed in the final production step after provision of the solder resist layer 23. When the releasing layer 13 is formed through the latter method, exposure of the releasing layer 13 to an etchant, a photoresist remover, etc. is prevented, thereby attaining a high releasing effect. As described hereinabove, the term "final production step" refers to as a step immediately before the product inspection step.

As described above, the releasing layer of the present invention is preferably formed after the photolithography step for forming wiring patterns 21 and before bonding with semiconductor chips. The reason for the timing is that the releasing layer is possibly dissolved in a photoresist layer removal step. Therefore, the releasing layer 13 is preferably formed immediately after completion of the photolithography step or after plating, more preferably after formation of the solder resist layer 23 or a similar step. Needless to say, the releasing layer 13 may also be formed before the photolithography step.

In this embodiment, a releasing layer 13 has been provided in advance on a COF laminate film 10. Thus, a desired mechanical strength of the tape so as to attain smooth conveyance can be advantageously ensured during production of a COF film carrier tape 20. In this embodiment, the COF laminate film 10 is produced by peeling the transfer film substrate 2 serving as a film substrate. However, the production method is not limited to the above manner, and there may be employed a method in which a releasing layer transfer film tape 1 is stuck to the COF laminate film 10 in advance and production steps are performed without peeling the transfer film substrate 2, followed by peeling the transfer film substrate 2 after completion of production steps. Through employment of the method, mechanical strength of the tape so as to attain smooth conveyance thereof can be sufficiently ensured.

Figure 5A:
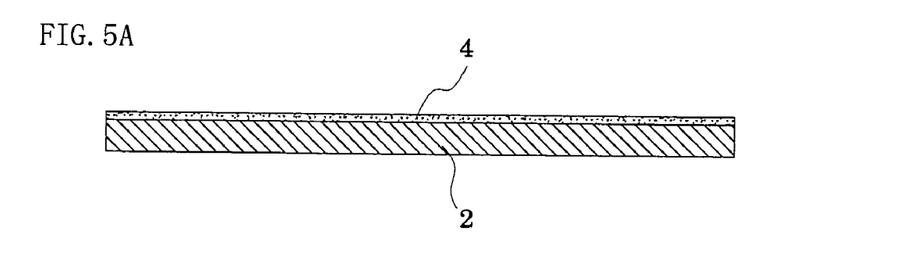
FIGS. 5(A) to 5(D) are cross-sectional views showing a releasing layer transfer film and a laminate film according to another embodiment of the present invention.
Figure 5B:
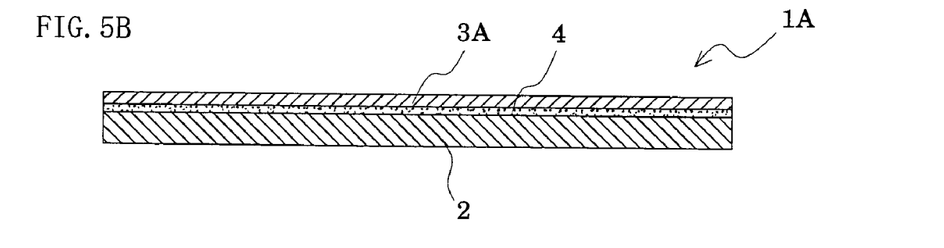
Figure 5C:
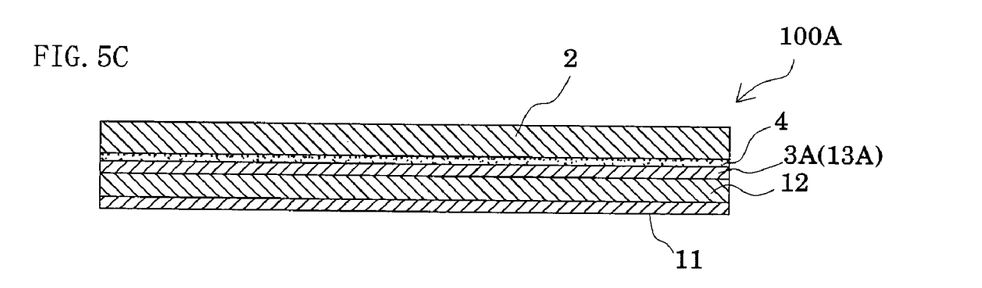
Figure 5D:
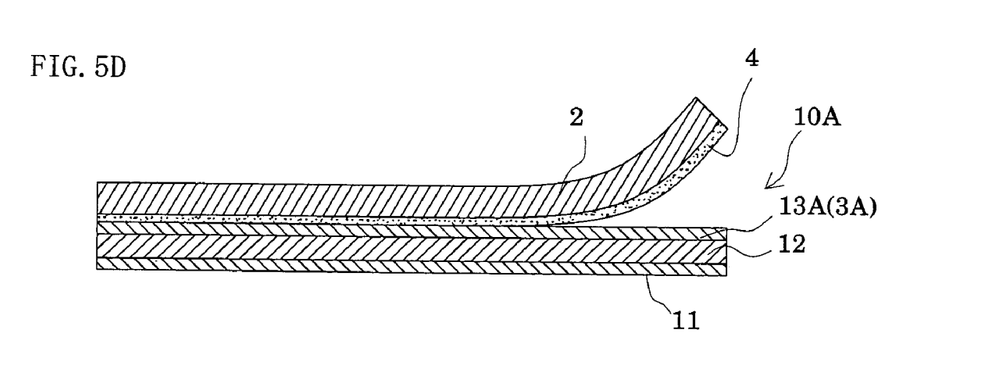

In the aforementioned embodiment according to the present invention, the transferable releasing layer 3 is provided on a surface of the transfer film substrate 2. However, as shown in FIG. 5, an adhesion layer 4 may be provided between the transfer film substrate 2 and the transferable releasing layer 3A. A releasing layer transfer film 1A shown in FIG. 5 is produced in the following procedure. Firstly, an adhesive is applied in a thickness of about 3 to 25 μm to a surface of a transfer film substrate 2 made of a material such as polyethylene terephthalate (PET), to thereby form an adhesion layer 4 that can be exclusively released from a transferable releasing layer 3A (FIG. 5(A)). Then, a releasing agent is applied on the surface of the adhesion layer 4, to thereby form the transferable releasing layer 3A (FIG. 5(B)). By use of the releasing layer transfer film 1A, the transferable releasing layer 3A formed; via the adhesion layer 4, on the transfer film substrate 2 serving as a film substrate is firmly attached to the surface of the insulating layer 12 opposite the side of the conductor layer 11, to thereby produce a laminate film 100A (FIG. 5(C)). As shown in FIG. 5(C), the laminate film 100A is composed of the transfer film substrate 2 (film substrate), the adhesion layer 4, the transferable releasing layer 3A (releasing layer 13A), the insulating layer 12, and the conductor layer 11. By heating the laminate film 100A and peeling the transfer film substrate 2, a COF laminate film 10A in which the releasing layer 13A is provided on the surface of the insulating layer 12 opposite the side of the conductor layer 11 is produced (FIG. 5(D)). In this case, the adhesion layer 4 is adhered to the transfer film substrate 2 but is peelable from the releasing layer 13A. Thus, when the transfer film substrate 2 is removed, the adhesion layer 4 is simultaneously peeled. Notably, no particular limitation is imposed on the transfer conditions, and the aforementioned conditions may be employed. The transfer film substrate 2 may be peeled at any timing; e.g., before a step of producing a COF film carrier tape or after the production step. When the transfer film substrate 2 is peeled after the production step, a desired mechanical strength of the tape so as to attain smooth conveyance thereof can be ensured. Even when the transfer film substrate 2 is peeled before the production step, a sufficient strength of the COF laminate film 10A so as to attain smooth conveyance thereof is ensured by virtue of the releasing layer 13A provided in a subsequent production step.

In any case, the configuration of the releasing layer transfer film and that of the laminate film of the present invention are not limited to those mentioned above. Any configuration may be employed so long as the configuration is able to provide a releasing layer which is made of a specific silicone-based compound and which has a pattern corresponding to the region present between the insulating layer and the below-mentioned heating tool, on the surface of the insulating layer opposite the side the semiconductor-chip-mount side through peeling of the transfer film substrate or the film substrate at any time before mounting of semiconductor chips.

Figure 6A:
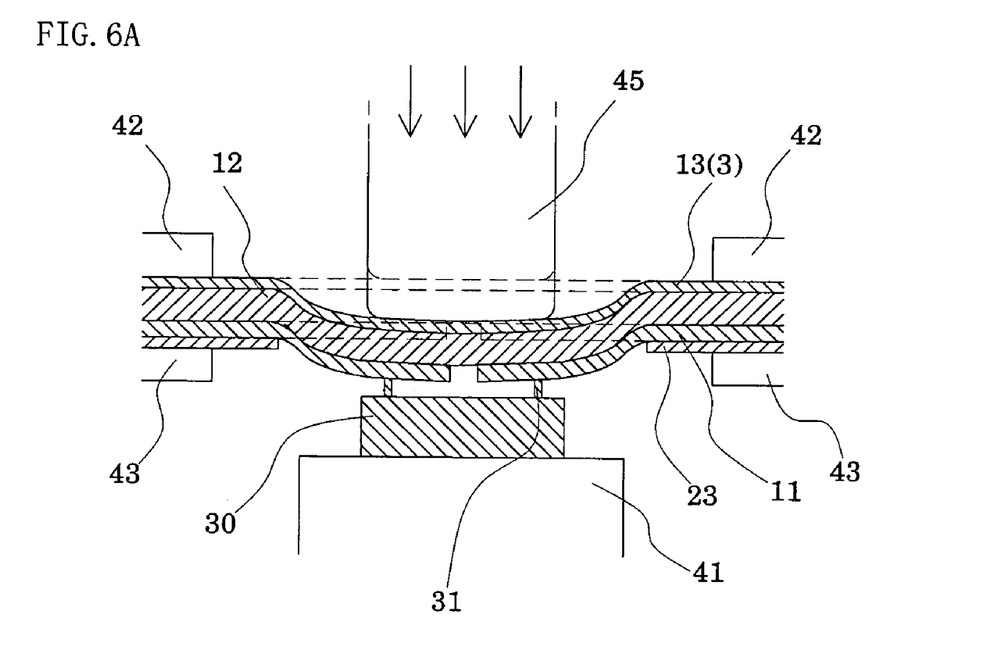
FIGS. 6(A) and 6(B) are cross-sectional views showing a semiconductor device and a production method thereof according to one embodiment of the present invention.
Figure 6B:
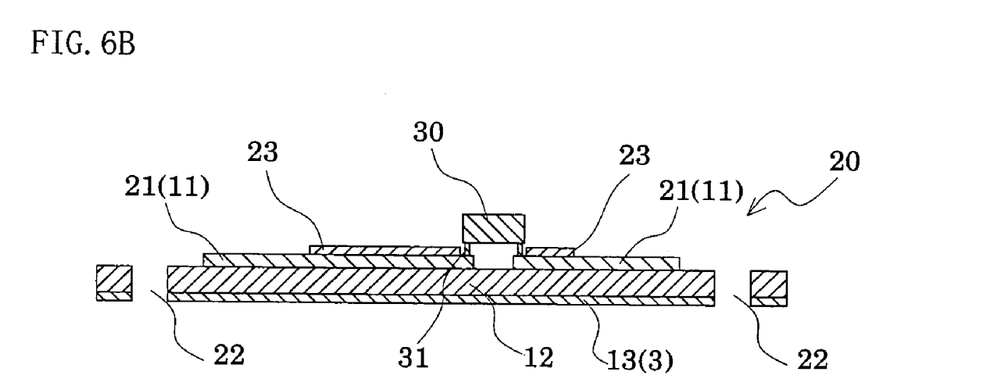

As shown in FIGS. 6(A) and 6(B), a semiconductor chip 30 is mounted on a COF film carrier tape 20 produced in the above-described manner. Specifically, the COF film carrier tape 20 is conveyed and then positioned at a predetermined position, while the semiconductor chip 30 is placed on a chip stage 41. Subsequently, the COF film carrier tape 20 is fixed by means of upper clamps 42 and lower clamps 43, with each upper clamp 42 descending while a corresponding lower clamp 43 ascending. A heating tool 45 is pressed against the thus-fixed COF film carrier tape 20 so as to heat the tape, and further descends, thereby pressing an inner lead of the COF film carrier tape 20 against a bump 31 of the semiconductor chip 30. Pressing is performed for a predetermined period of time, thereby bonding the inner lead and the semiconductor chip 30. After completion of bonding, the bonded chip is sealed with resin, to thereby produce a semiconductor device.

Depending on time and pressure of pressing or other conditions, the temperature of the heating tool 45 is controlled to 200° C. or higher, preferably 350° C. or higher. According to the present invention, even when the heating tool 45 is heated to such high temperature, melt adhesion between the COF film carrier tape 20 and the heating tool 45 is prevented by virtue of a releasing layer 13 provided on a surface of the film carrier tape 20 to be brought into contact with the heating tool 45. Therefore, according to the present invention, bonding can be performed at sufficiently high temperature, thereby ensuring high bonding strength. In other words, since heating temperature can be elevated for attaining a predetermined level of bonding strength, the time required for press bonding can be shortened, which is advantageous.

EXAMPLE 1

A silicone-base releasing agent was applied onto a surface of a transfer film substrate 2 (thickness: 50 μm) made of PET film, to thereby prepare a releasing layer transfer film 1 having a transferable releasing layer 3 (thickness: 0.1 μm) made of a silane-containing silicone-based compound. Subsequently, a polyimide layer (thickness: 40 μm) serving as an insulating layer 12 is formed through coating on ultra-low-roughness copper foil (thickness: 9 μm) serving as a conductor layer 11. On the surface of the insulating layer 12 opposite the side of the conductor layer 11, a releasing layer 13 composed of a transferable releasing layer 3 (thickness: 0.1 μm) is provided through the transfer method by use of the aforementioned releasing layer transfer film 1, to thereby form a COF laminate film of the Examples. After transfer of the releasing layer 13 formed of a silicone-based compound, the laminate film was heat-treated at 120° C.

EXAMPLE 2

The procedure of Example 1 was repeated, except that heat treatment after transfer of the releasing layer formed of a silicone-based compound was not performed, to thereby produce a COF laminate film of Example 2.

EXAMPLE 3

The procedure of Example 1 was repeated. However, the releasing layer transfer film 1 was prepared by forming a transferable releasing layer 3 by use of SEPA-COAT (trade name: product of Shin-Etsu Chemical Co., Ltd., containing silazane) serving as a releasing agent for forming a silicone-based compound releasing layer, and the releasing layer 13 was transferred onto a surface of the insulating layer 12 by use of the releasing layer transfer film 1. Thus, a COF laminate film of Example 3 was prepared.

EXAMPLE 4

The procedure of Example 1 was repeated. However, the releasing layer transfer film 1 was prepared by forming a transferable releasing layer 3 by use of COLCOAT P (trade name: product of Colcoat Co., Ltd., containing silica sol) serving as a releasing agent for forming a silicone-based compound releasing layer, and the releasing layer 13 made of a transferable releasing layer 3 was formed through hot-press transfer by use of the releasing layer transfer film 1 at 120° C. under application of a load of 20 kg/cm$^2$ for 30 minutes. Thus, a COF laminate film of Example 4 was prepared.

COMPARATIVE EXAMPLE 1

The procedure of Example 1 was repeated, except that no releasing layer 13 was provided, to thereby produce a COF laminate film.

TEST EXAMPLE 1

The conductor layer 11 of each of COF laminate films of Examples 1 to 4 and Comparative Example 1 was patterned, and the entirety of the wiring pattern was tin-plated and coated with a solder resist layer, to thereby produce a COF film carrier tape. A heating tool was pressed against the releasing layer 13 of each of COF film carrier tapes, and the temperature of the heating tool was varied within a range of 260° C. to 440° C. Under the heating conditions, semiconductor chips were mounted. Adhesion between the releasing layer and the heating tool was observed. The results are shown in Table 1.

The results indicate the following. Adhesion occurs at 300° C. or higher in Comparative Example 1. Good anti-adhesion performance was observed in Example 2, wherein adhesion occurs in a portion of the releasing layer at 320° C. or higher. In Examples 1, 3, and 4, no adhesion occurs until the temperature of the heating tool exceeds 400° C. The effect observed in Example 2 was higher than that observed in Comparative Example 1 but was not remarkable. However, since the temperature of melt adhesion varies depending on the type of heating tools, the type of semiconductor chips mounted, use of mounted products, etc. and may be generally 200 to 350° C., the elevated temperature at which adhesion occurs in Example 2 was also advantageous.

TABLE 1

| Tool temp. (° C.) | Ex. 1 | Ex. 2 | Ex. 3 | Ex. 4 | Comp. Ex. 1 |
|---|---|---|---|---|---|
| 260 | ○ | ○ | ○ | ○ | ○ |
| 280 | ○ | ○ | ○ | ○ | ○ |
| 300 | ○ | ○ | ○ | ○ | X |
| 320 | ○ | Δ | ○ | ○ | X |
| 340 | ○ | Δ | ○ | ○ | X |
| 360 | ○ | X | ○ | ○ | X |
| 380 | ○ | X | ○ | ○ | X |
| 400 | ○ | X | ○ | ○ | X |
| 420 | X | X | ○ | X | X |
| 440 | X | X | X | X | X |

Note:
○; no adhesion,
Δ; partially adhered, and
X; adhered

The invention claimed is:
1. A releasing layer transfer film for forming a releasing layer onto an insulating layer serving as a component of a chip-on-film flexible printed wiring board, characterized in that the releasing layer transfer film comprises a transfer film substrate, and a transferable releasing layer provided on a surface of the transfer film substrate, wherein the transfer- able releasing layer is formed from a releasing agent comprising a silazane compound and can be transferred onto the insulating layer.

2. A releasing layer transfer film according to claim 1, wherein the transferable releasing layer is formed by applying a solution of the releasing agent onto the transfer film substrate, and heating.

3. A releasing layer transfer film according to claim 1, wherein the transferable releasing layer is transferred by firmly affixing the transferable releasing layer to the insulating layer, followed by heating.

4. A releasing layer transfer film according to claim 1, wherein the transferable releasing layer is provided on a surface of the transfer film substrate continuously or in the form of dispersed islands.

5. A releasing layer transfer film according to claim 1, wherein the transferable releasing layer is transferred onto the insulating layer continuously or in the form of dispersed islands.

6. A releasing layer transfer film according to claim 1, wherein the transferable releasing layer is provided so as to correspond to a region for forming a wiring pattern, the region intervening in at least two rows of sprocket holes of the COF flexible printed wiring board.

7. A releasing layer transfer film according to claim 6, wherein the COF flexible wiring board has at least two rows of wiring-pattern-formed regions, and the transferable releasing layer is shaped into a plurality strips corresponding to the wiring patterns.

8. A releasing layer transfer film according to claim 1, which has an adhesion layer between the transfer film substrate and the transferable releasing layer.

9. A releasing layer transfer film according to claim 1, wherein the transfer film substrate is affixed onto the insulating layer so as to serve as a reinforcing film during a production step of the COF flexible printed wiring board.

10. A releasing layer transfer film according to claim 1, which has, on a surface of the transferable releasing layer opposite to the transfer film substrate, a peelable film that can be peeled from the transferable releasing layer.

11. A laminate film, comprising a film substrate, a releasing layer provided on a surface of the film substrate, an insulating layer provided on the surface of the releasing layer opposite the side of the film substrate, and a conductor layer provided on the surface of the insulating layer opposite the side of the releasing layer, wherein the releasing layer is formed from a releasing agent containing at least one species selected from a silane compound, a silica sol and a silazane compound, and the insulating layer serves as a member of a COF flexible printed wiring board.

12. A laminate film according to claim 11, wherein the releasing layer is formed from a releasing agent containing a silazane compound.

13. A laminate film according to claim 11, which has an adhesion layer between the film substrate and the releasing layer.

14. A method for producing a COF flexible printed wiring board, the method comprising laminating, onto an insulating layer serving as a component of a COF flexible printed wiring board, a releasing layer transfer film comprising a transfer film substrate, and a transferable releasing layer provided on a surface of the transfer film substrate, such that the transferable releasing layer is laminated on the insulating layer;

forming a wiring pattern from a layer provided on the surface of the insulating layer opposite the surface on which the releasing layer transfer film has been laminated to thereby produce a COF flexible printed wiring board; and peeling the transfer film substrate, to thereby transfer the transferable releasing layer onto the insulating layer, whereby a COF flexible printed wiring board having a releasing layer on the insulating layer is produced;

wherein the releasing layer is formed from a releasing agent containing at least one species selected from a silane compound, a silica sol and a silazane compound, and the insulating layer serves as a member of a COF flexible printed wiring board.

15. A method for producing a COF flexible printed wiring board according to claim 14, wherein the releasing layer is transferred onto the insulating layer through heating before or while peeling the film substrate.

16. A method for producing a COF flexible printed wiring board according to claim 14, wherein the releasing layer is transferred onto a surface of the insulating layer continuously or in the form of dispersed islands.

* * * * *

UNITED STATES PATENT AND TRADEMARK OFFICE
CERTIFICATE OF CORRECTION

| | | |
|---|---|---|
| PATENT NO. | : 7,255,919 B2 | |
| APPLICATION NO. | : 10/507242 | |
| DATED | : August 14, 2007 | |
| INVENTOR(S) | : Ken Sakata and Katsuhiko Hayashi | |

It is certified that error appears in the above-identified patent and that said Letters Patent is hereby corrected as shown below:

Column 16, line 62, claim 1, should read:

1. A releasing layer transfer film for forming a releasing layer onto an insulating layer serving as a component of a chip-on-film (COF) flexible printed wiring board, characterized in that the releasing layer transfer film comprises a transfer film substrate, and a transferable releasing layer provided on a surface of the transfer film substrate, wherein the transferable releasing layer is formed from a releasing agent comprising a silazane compound and can be transferred onto the insulating layer.

Column 18, line 13, claim 14, should read:

14. A method for producing a COF flexible printed wiring board, the method comprising
        laminating, onto an insulating layer serving as a component of a COF flexible printed wiring board, a releasing layer transfer film comprising a transfer film substrate, and a transferable releasing layer provided on a surface of the transfer film substrate, such that the transferable releasing layer is laminated on the insulating layer;
        forming a wiring pattern ~~from a~~ in a conductor layer provided on the surface of the insulating layer opposite the surface on which the releasing layer transfer film has been laminated to thereby produce a COF flexible printed wiring board; and
        peeling the transfer film substrate, to thereby transfer the transferable releasing layer onto the insulating layer, whereby a COF flexible printed wiring board having a releasing layer on the insulating layer is produced;

UNITED STATES PATENT AND TRADEMARK OFFICE
CERTIFICATE OF CORRECTION

PATENT NO. : 7,255,919 B2
APPLICATION NO. : 10/507242
DATED : August 14, 2007
INVENTOR(S) : Ken Sakata and Katsuhiko Hayashi It is certified that error appears in the above-identified patent and that said Letters Patent is hereby corrected as shown below:

wherein the releasing layer is formed from a releasing agent containing at least one species selected from a silane compound, a silica sol and a silazane compound, and the insulating layer serves as a member of a COF flexible printed wiring board.

Signed and Sealed this

Eighth Day of September, 2009

David J. Kappos
*Director of the United States Patent and Trademark Office*